United States Patent
Meloling et al.

(10) Patent No.: US 6,842,013 B1
(45) Date of Patent: Jan. 11, 2005

(54) METHOD FOR MAKING TRANSMISSION MEASUREMENTS IN A DUAL-CHAMBERED ANECHOIC CHAMBER USING SPATIAL AVERAGING

(75) Inventors: John Harold Meloling, San Diego, CA (US); David Earl Hurdsman, La Mesa, CA (US); Wendy Marie Massey, San Diego, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 10/868,455

(22) Filed: Jun. 9, 2004

Related U.S. Application Data

(62) Division of application No. 10/227,636, filed on Aug. 21, 2002, now Pat. No. 6,784,670.

(51) Int. Cl.$^7$ .......................... G01R 27/04; G01R 27/32
(52) U.S. Cl. .......................... 324/637; 324/627; 702/57
(58) Field of Search .................. 324/627, 629, 324/631, 637, 649; 343/703, 786; 702/57

(56) References Cited

U.S. PATENT DOCUMENTS 6,697,744 B2 * 2/2004 Uesaka et al. ................ 702/57

* cited by examiner

*Primary Examiner*—Vincent Q. Nguyen
(74) *Attorney, Agent, or Firm*—Celia C. Dunham; Michael A. Kagan; Peter A. Lipovsky

(57) ABSTRACT

A method for making transmission measurements in a dual-chambered anechoic chamber used in conjunction with spatial averaging. At selected transmitter antenna positions, measurement are taken at different frequencies. For each transmitter position, a measurement is made with the test device positioned between the apertures, and another without the test device. When all desired measurements have been made, the measurement data are spatially averaged; i.e., the measurements are scaled, summed, and averaged, providing more accurate transmission measurements.

4 Claims, 8 Drawing Sheets

METHOD FOR MAKING TRANSMISSION MEASUREMENTS IN A DUAL-CHAMBERED ANECHOIC CHAMBER USING SPATIAL AVERAGING

CROSS REFERENCE TO RELATED APPLICATIONS

This application is a division of commonly assigned U.S. patent application Ser. No. 10/227,636, entitled DUAL CHAMBERED ANECHOIC CHAMBER, filed Aug. 21, 2002 now U.S. Pat. No. 6,784,670, which is hereby incorporated by reference.

BACKGROUND OF THE INVENTION

This invention relates generally to the field of anechoic chambers. More specifically, this invention relates to a dual-chambered anechoic chamber used in conjunction with spatial averaging for making transmission measurements of electromagnetic devices.

Large anechoic chambers are used to perform transmission measurements. Building space requirements contribute to the high construction costs of these large chambers, limiting their availability. Box anechoic chambers, which are limited by the box shape and the shape of the aperture, are a less expensive alternative to the large chambers. Enlarging the chamber and thickening the absorber material can achieve increased performance of box chambers, but cost remains a factor.

Thus, there is a need for a relatively small anechoic chamber, which provides accurate transmission measurements without the high costs associated with larger anechoic chambers.

SUMMARY OF THE INVENTION

The invention is a method for making transmission measurements of electromagnetic devices using a dual-chambered anechoic chamber. RF transmission characteristics measured include frequency and time responses. Electromagnetic devices that may be measured include any device with a planar structure.

RF energy returning from nearby reflectors interferes with measurement accuracy. Anechoic chambers eliminate such reflections. When using the dual-chambered anechoic chamber for making measurements, spatial averaging may be used to improve accurate transmission measurements. At each selected test frequency, measurement data are recorded a predetermined number of times at different transmitter antenna positions. For each transmitter antenna position, two measurements are made: one measurement with the test device positioned between the first and second apertures, and another measurement without the test device. Finally, when all desired transmission measurements have been completed, the measurement data are spatially averaged; i.e., (a) for each transmitter antenna position, the two measurements are scaled by dividing the measurement with the test device by the measurement without the test device; (b) the scaled measurements for the different antenna positions are summed; and (c) the summed values are averaged by the number of antenna positions used. Thus, at the selected test frequencies, each spatially averaged measurement corresponds to several measurements that have been scaled, summed, and averaged, providing more accurate transmission measurements.

BRIEF DESCRIPTION OF THE DRAWINGS

For a more complete understanding of the method for making transmission measurements in a dual-chambered anechoic chamber using spatial averaging, reference is now made to the following detailed description of the embodiments as illustrated in the accompanying drawings wherein.

DESCRIPTION OF THE PREFERRED EMBODIMENT

Figure 1:
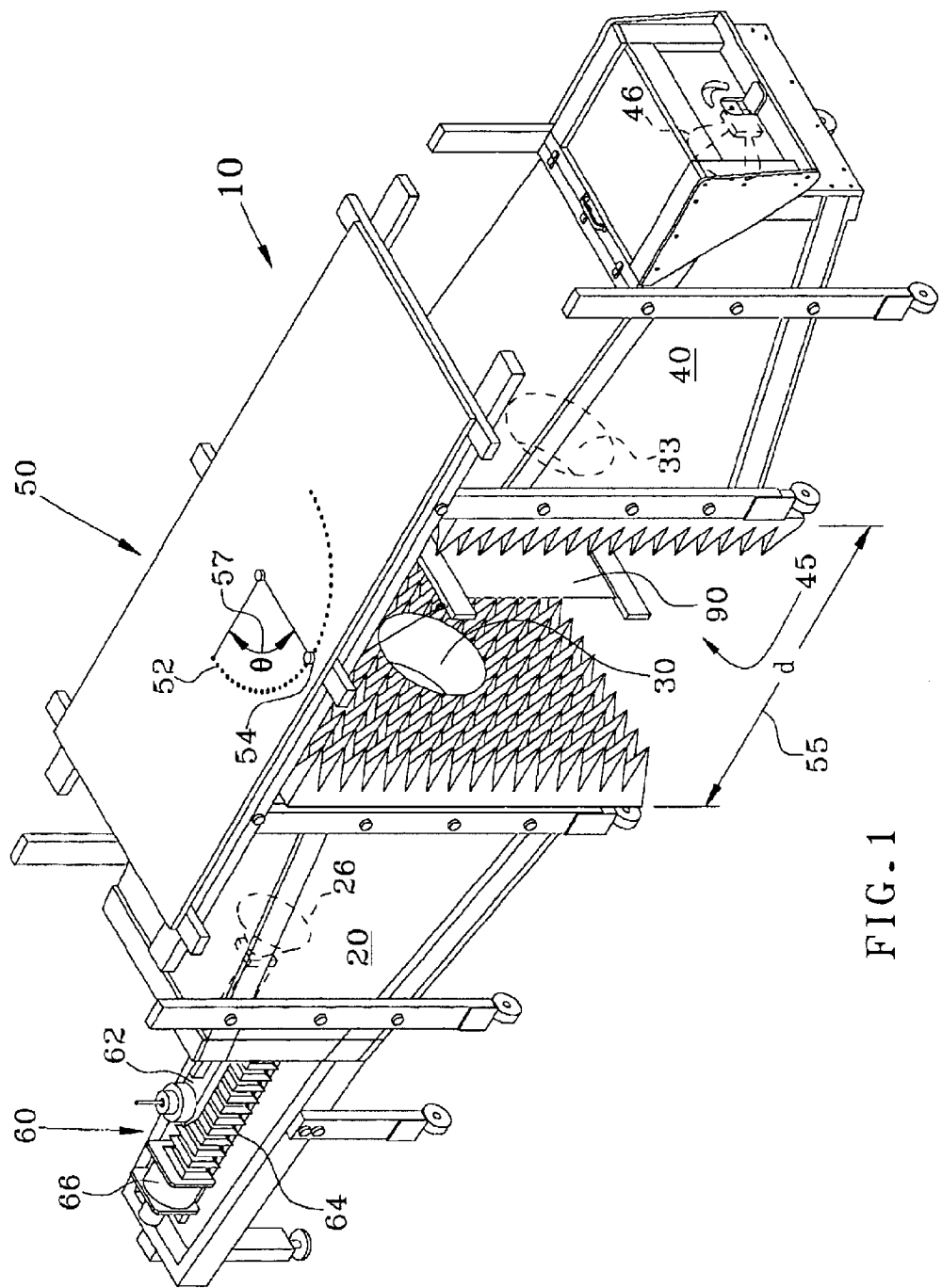
FIG. 1 is an isometric view of the dual-chambered anechoic chamber used for making transmission measurements in conjunction with spatial averaging.

FIG. 1 shows anechoic chamber 10, which comprises two separate and distinct chambers: a first tapered chamber 20 with a first aperture 30, and a second tapered chamber 40 with a second aperture 33 (hidden) opposed to the first aperture 30. Anechoic chamber 10 further comprises an unenclosed testing region 45 located outside of the chambers and in between the apertures and an alignment apparatus 50 for aligning the two chambers (20,40) and for proper positioning of a test device 90, the device under test, between the first aperture 30 and second aperture 33. The alignment apparatus 50 operates to adjust the separation distance 55 between the two tapered chambers (20, 40), thus allowing unenclosed testing region 45 to be varied in area size. In addition, the alignment apparatus 50 is also used to control the incidence angle 57 of the test device 90. The incidence angle 57 is adjusted by selecting the appropriate alignment hole 52 for placement of bolt 54 on top of the alignment apparatus 50.

A transmitter antenna 26 (hidden) in the first chamber 20 transmits a test signal that is received by a receiver antenna 46 (hidden) in the second chamber 40. The anechoic chamber 10 has a positioning mechanism 60 that includes a support means 62 for mounting the transmitter antenna 26 and a control means (64, 66) for changing the position of the transmitter antenna 26. In a preferred embodiment, the support means includes an extender bar 62 and the control means includes a sliding mechanism 64 and a stepper motor 66. The extender bar 62, on which the transmitter antenna is mounted, keeps the sliding mechanism 64 and stepper motor 66 out of the measurement field. The sliding mechanism 64 and stepper motor 66 allow movement of the transmitter antenna in the first chamber 20, thereby varying the distance between the transmitter and receiver antennas.

Figure 2:
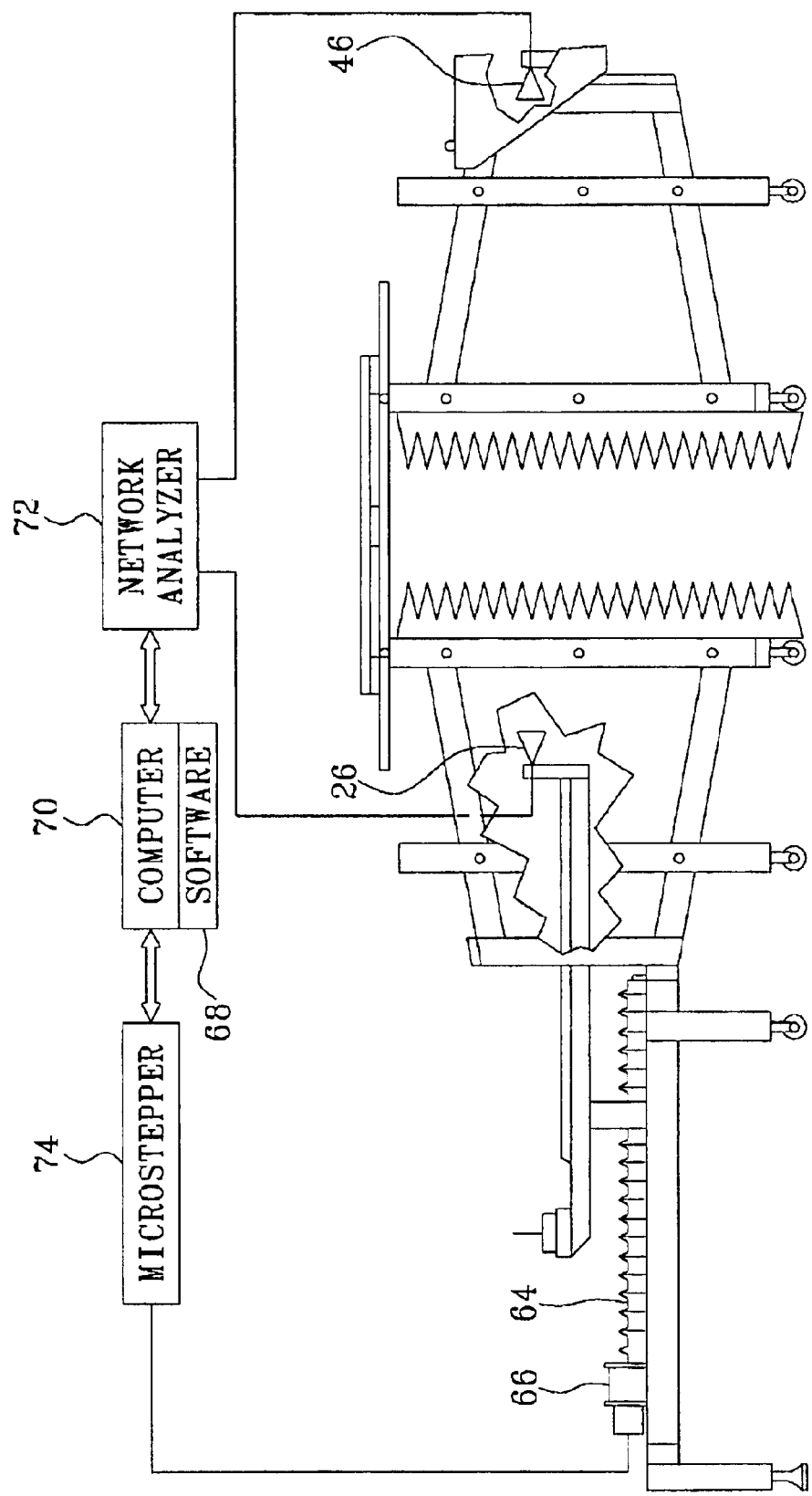
FIG. 2 is an illustration of a general measurement setup using the anechoic chamber of FIG. 1.

FIG. 2 illustrates the general measurement setup for using the dual-chambered anechoic chamber of FIG. 1. The measurement process is controlled using a data acquisition software package 68, such as LabView, on a computer 70 that is coupled to a network analyzer 72, such as the HP 851° C. Network Analyzer, and a microstepper 74 for controlling the stepper motor 66. Several steps are required for accurate movement of the sliding mechanism 64. The LabView software 68 sends movement commands containing the direction and distance to the computer 70, which then relays the command to the microstepper 74, and which then sends the final command to the stepper motor 66.

Figure 3A:
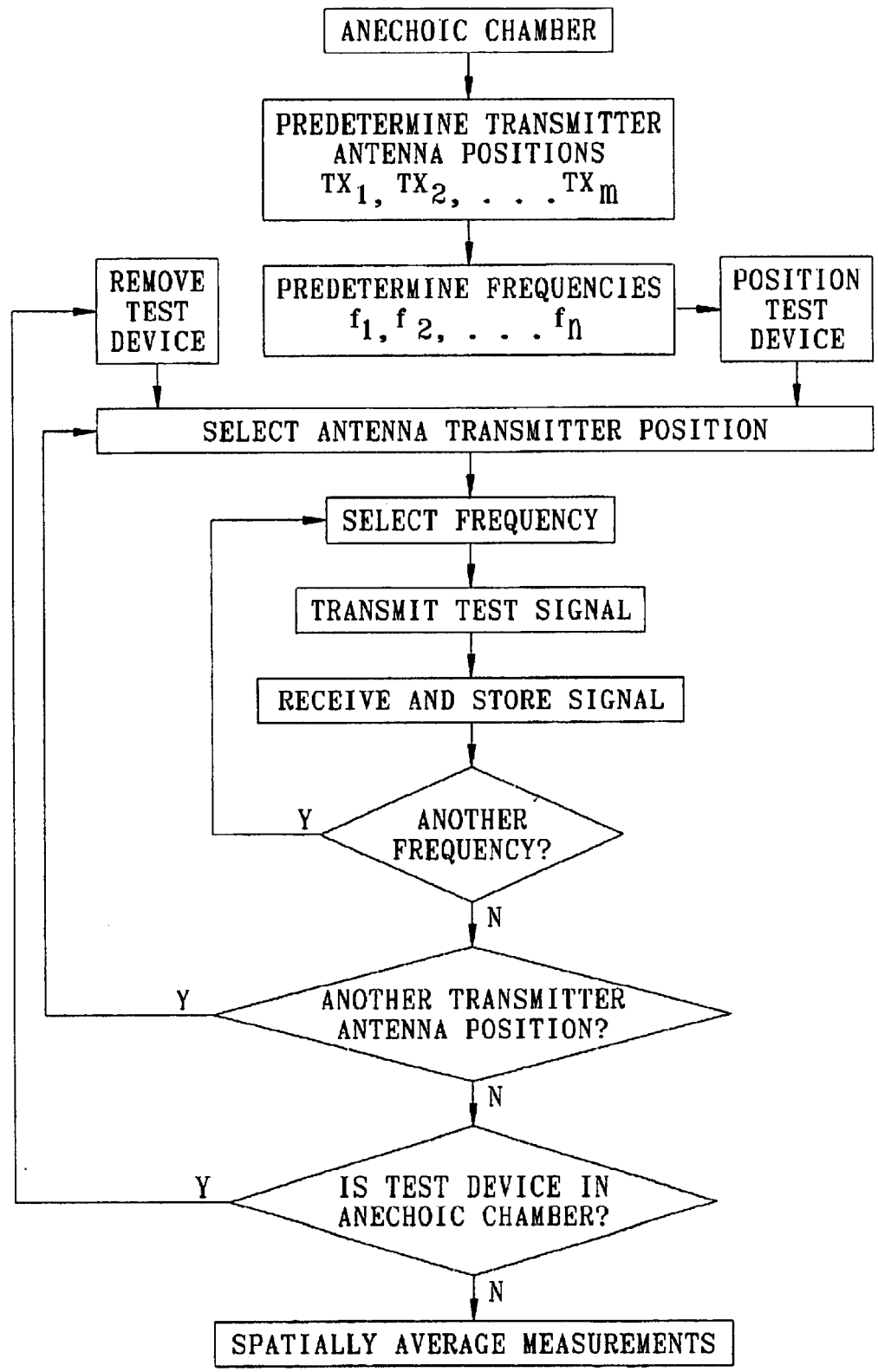
FIGS. 3A, 3B, 3C, and 3D are flow charts illustrating the method of making transmission measurements using the anechoic chamber of FIG. 1.

When using the dual-chambered anechoic chamber for making transmission measurements of electromagnetic devices, spatial averaging may be used to improve the accuracy of the measurements. FIG. 3A is a flow chart of the preferred method of making transmission measurements using the dual-anechoic chamber and processing the measurement data. At each selected transmitter antenna position, measurements are taken a predetermined number of times at different frequencies. For each transmitter antenna position, two measurements are made in no particular order: one measurement with an electromagnetic device, the test device, positioned between the first and second apertures, and a second measurement without the test device. When all desired transmission measurements have been made at the desired transmitter antenna positions at the selected frequencies, the measurement data are spatially averaged; i.e., (a) for each transmitter antenna position, the two measurements are scaled by dividing the measurement with the test device by the measurement without the test device; (b) the scaled measurements for the different antenna positions are summed; and (c) the summed values are averaged by the number of antenna positions used. Thus, at the selected frequencies, each spatially averaged measurement corresponds to the measurements taken at the different antenna positions and which have been scaled, summed, and averaged, providing a more accurate transmission measurement.

Figure 3B:
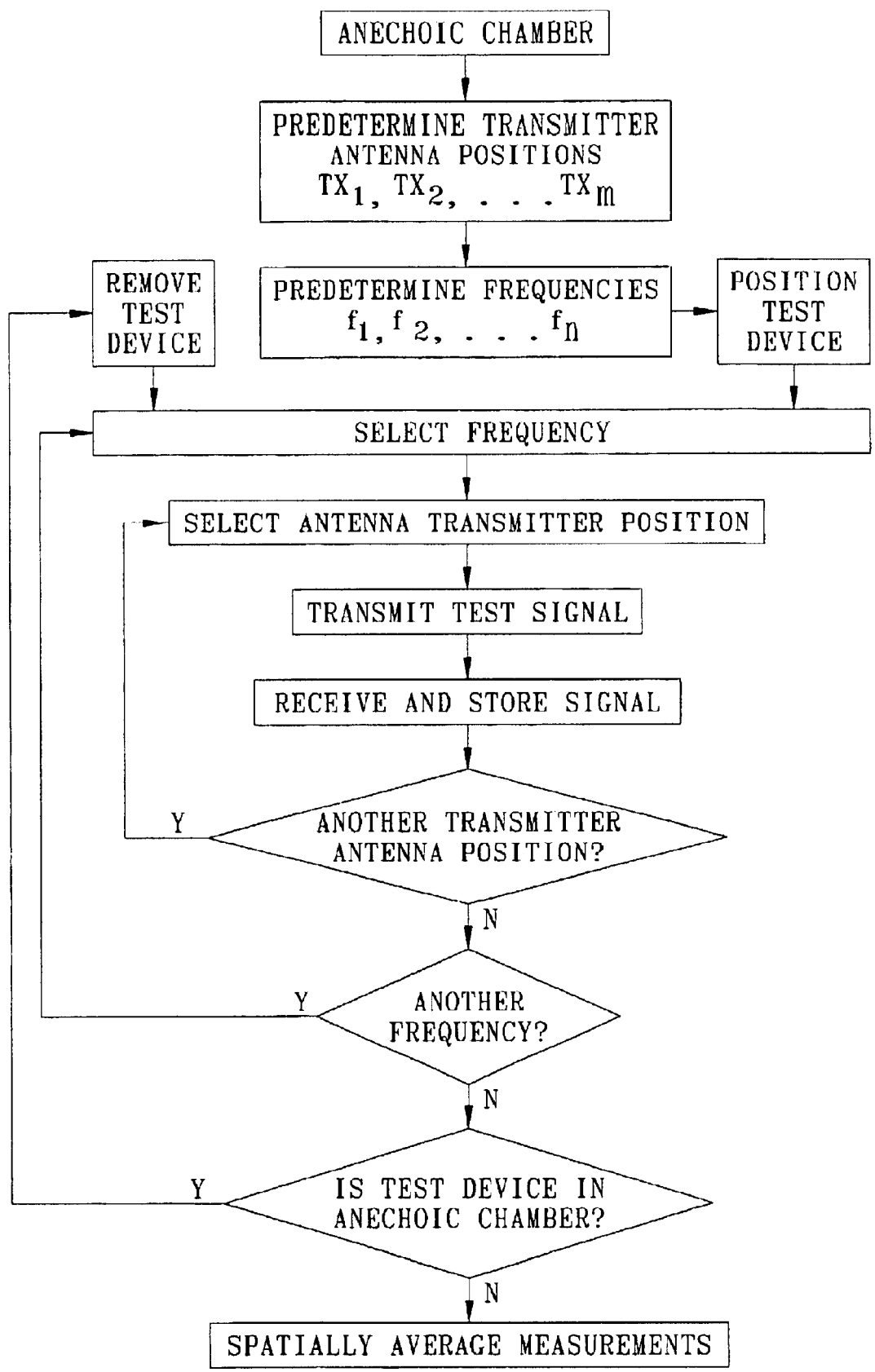
Figure 3C:
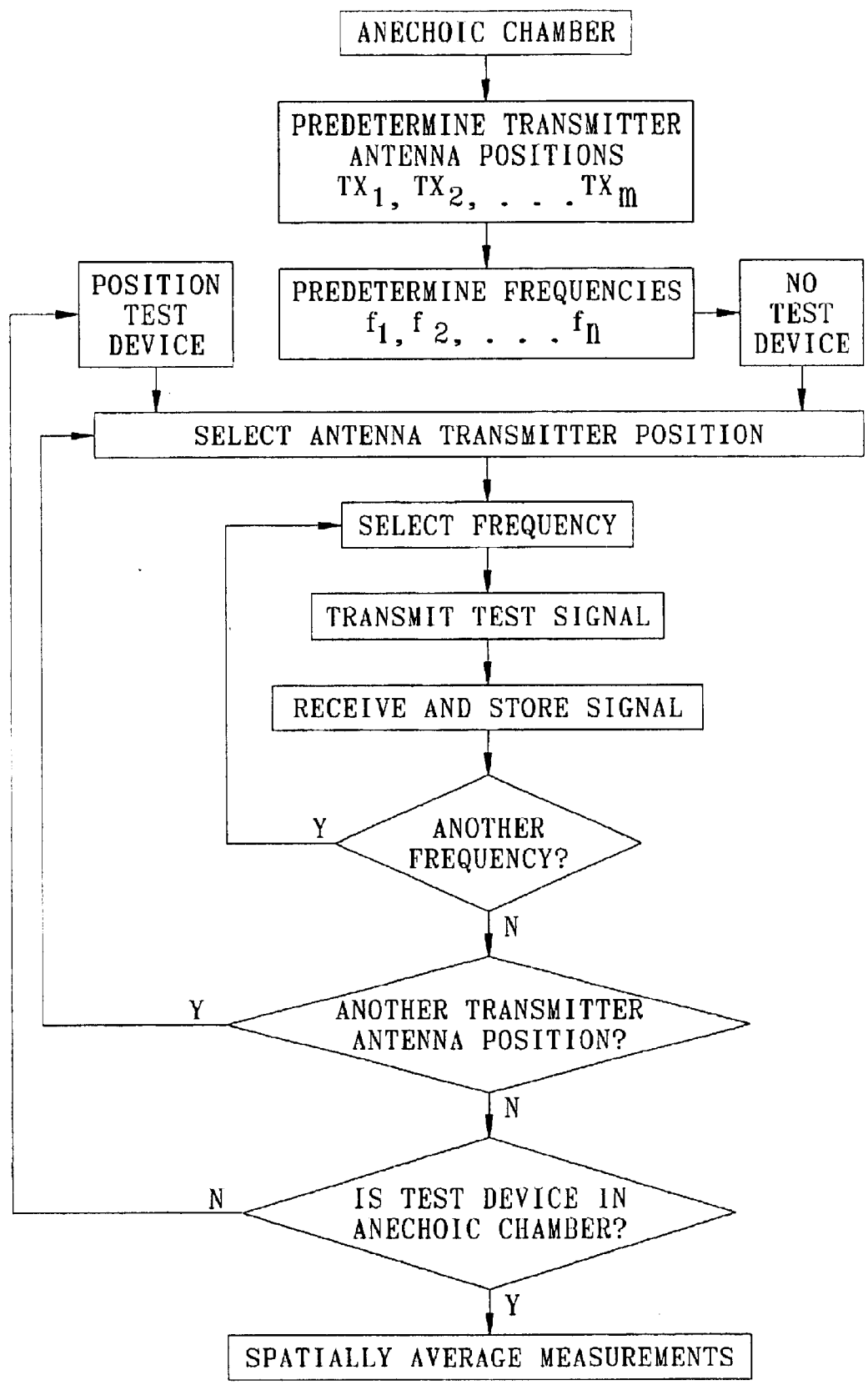
Figure 3D:
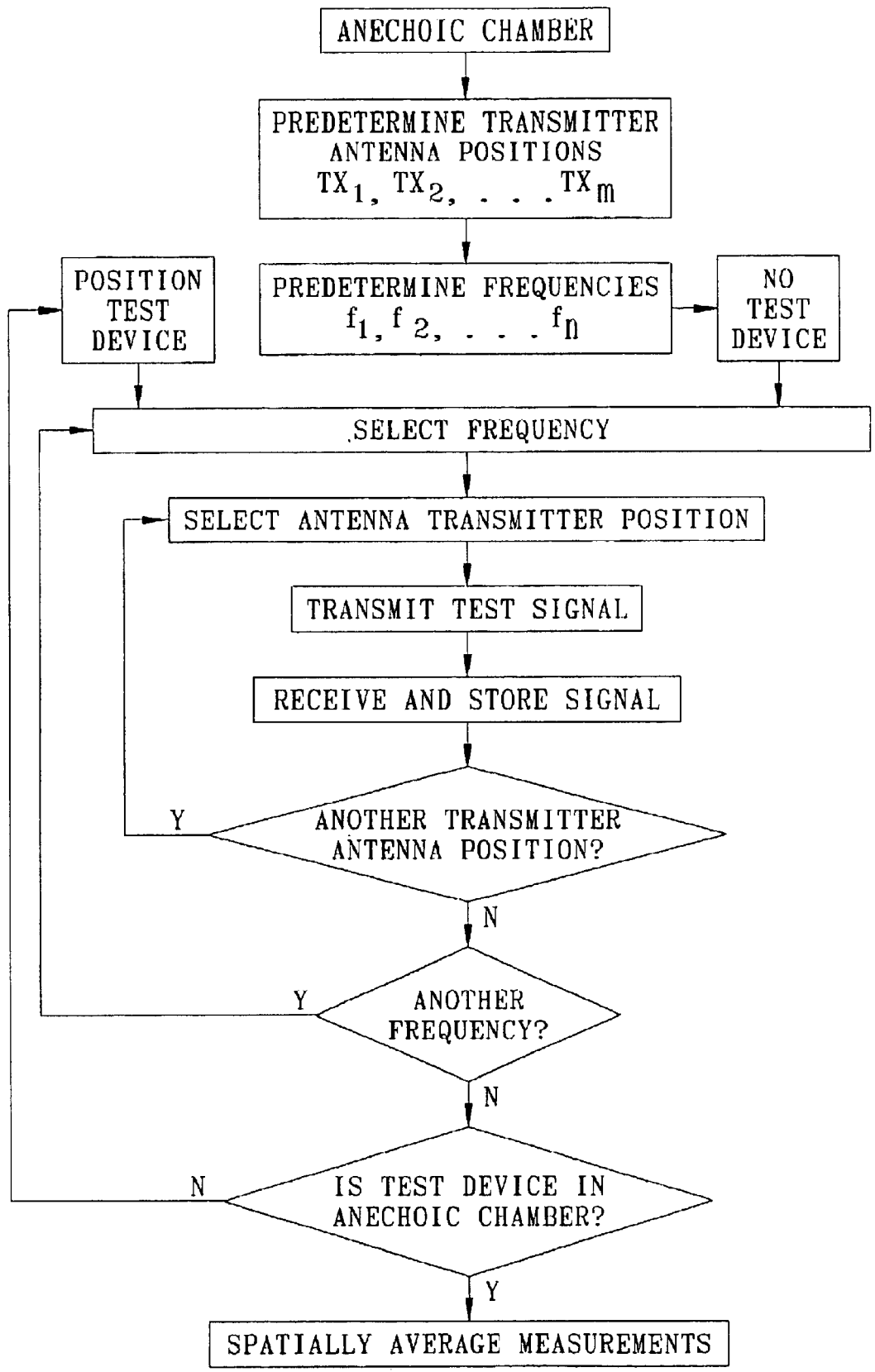

As shown in FIGS. 3B, 3C, and 3D, the order of the steps of selecting the frequency and selecting the transmitter antenna position is not specific and may be reversed. Similarly, the order of the steps of making transmission measurements with the test device positioned between the first and second apertures and making transmission measurements without the test device is not specific and may also be reversed.

Figure 3E:
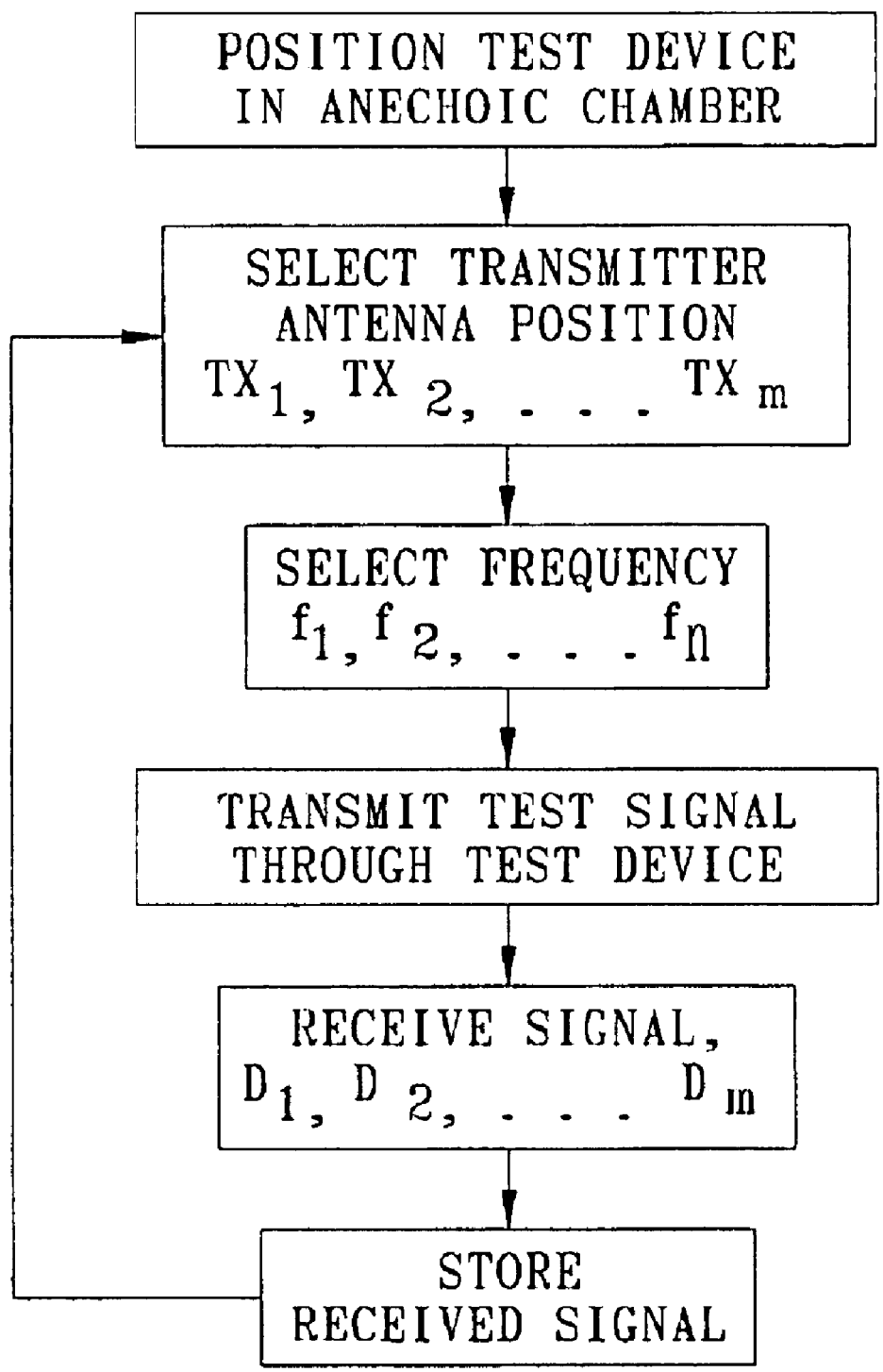
FIG. 3E is a more detailed flow chart of the step of making transmission measurements with the test device in the anechoic chamber of FIG. 1.

FIG. 3E is a more detailed flow chart of the step of making transmission measurements with the test device in the anechoic chamber. For each selected transmitter antenna position, the desired frequencies, $f_1, f_2, \ldots, f_n$, are selected for the transmitter antenna. A test signal is transmitted from the transmitter antenna through the test device to a receiver antenna. The received signal, $D_1, D_2, \ldots, D_m$, is stored. The steps of positioning the transmitter antenna, transmitting the test signal, and storing the received signal are repeated until measurements have been done at the desired m number of transmitter antenna positions.

Figure 3F:
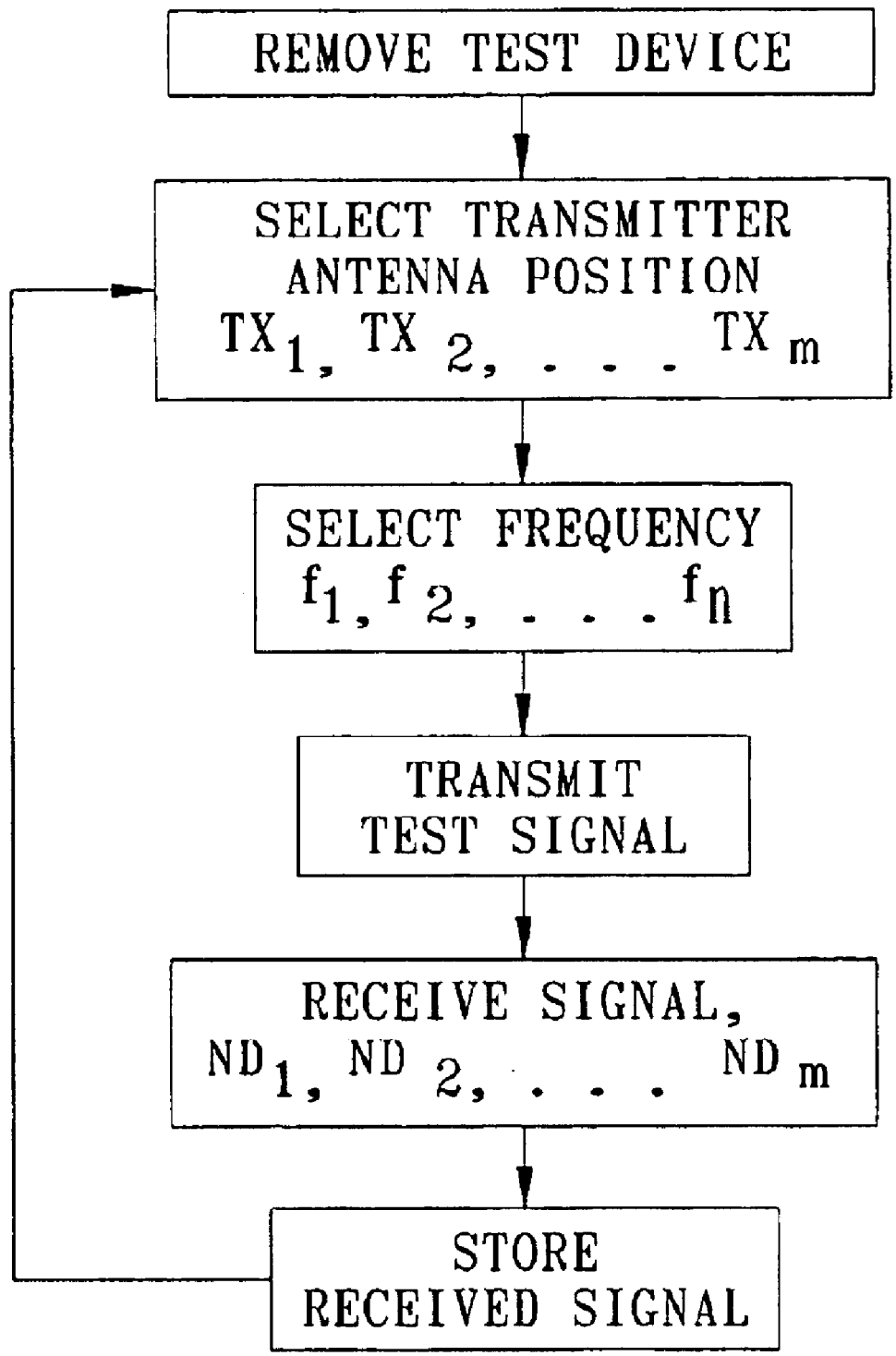
FIG. 3F is a more detailed flow chart of the step of making transmission measurements without the test device in the anechoic chamber of FIG. 1.

For each transmitter antenna position where measurements were made with a test device, transmission measurements are made without the test device at the corresponding frequencies as shown in FIG. 3F. For each selected position, the desired frequency, $f_1, f_2, \ldots, f_n$, is selected for the transmitter antenna. A test signal is transmitted from the transmitter antenna to a receiver antenna. The received signal, $ND_1, ND_2, \ldots, ND_m$, is stored. The steps of positioning the transmitter antenna, transmitting the test signal, and storing the received signal are repeated until measurements have been done at the desired m number of transmitter antenna positions.

Finally, when all desired transmission measurements have been made, the measurement data are spatially averaged; i.e., (a) for each transmitter antenna position, the two measurements are scaled by dividing each measurement with the test device by the measurement without the test device; (b) the scaled measurements are summed; and (c) the summed values are averaged by the number of antenna positions used. At the selected frequencies, the spatially averaged measurement, SAM, is then determined in accordance with the relation:

$$SAM = [(D_1/ND_1) + (D_2/ND_2) + \ldots + (D_m/ND_m)]/m,$$

where $D_1, D_2, \ldots D_m$ represents the m number of measurements with the test device in the anechoic chamber;

$ND_1, ND_2, \ldots ND_m$ represent the m number of measurements without the test device; and m is a positive integer.

Thus, at the selected frequencies, the spatially averaged measurement corresponds to a combination of the measurements taken at the different antenna positions and which have been scaled, summed, and averaged, providing a more accurate transmission measurement.

Clearly, many modifications and variations of the method for making transmission measurements in a dual-chambered anechoic chamber using spatial averaging are possible in light of the above teachings. It is therefore to be understood that within the scope of the appended claims, the method for making transmission measurements in a dual-chambered anechoic chamber using spatial averaging may be practiced otherwise than as specifically described.

We claim:

1. A method for making transmission measurements of electromagnetic devices comprising the steps of:

(a) positioning the electromagnetic device in an anechoic chamber, (b) selecting a frequency from a plurality of desired frequencies, $f_1, f_2, \ldots, f_n$, where n is a positive integer;

(c) selecting a position from a plurality of desired positions, $Tx_1, Tx_2, \ldots, Tx_m$, for a transmitter antenna in the anechoic chamber;

(d) making a first transmission measurement with the electromagnetic device in the anechoic chamber and making a second transmission measurement without the electromagnetic device at the selected frequency and position;

(e) repeating the measuring steps to obtain a plurality of transmission values at all of the desired transmitter antenna positions, $Tx_1, Tx_2, \ldots, Tx_m$, and at all of the desired frequencies, $f_1, f_2, \ldots, f_n$; and (f) spatially averaging the plurality of transmission values.

2. The method for making transmission measurements of claim 1 wherein said anechoic chamber comprises:

a tapered first chamber having first and second ends, the first end being open and the second end having a first aperture; a tapered second chamber having first and second ends, the second end having a second aperture, wherein the second chamber is separated from the first chamber by an adjustable separation distance d such that the first and second apertures are opposed;

an unenclosed testing region located outside of the first and second chambers and in between the first and second apertures, the testing region having an adjustable area controlled by the separation distance d between the first and second chambers;

an alignment apparatus coupled to the first and second chambers for controlling the separation distance d between the chambers, for controlling the size of the area of the testing region, and for positioning the electromagnetic device between the apertures;

a transmitter antenna disposed within the first chamber for transmitting a test signal;

a positioning mechanism connected to the exterior of the first end of the first chamber for varying the position of the transmitter antenna along a line orthogonal to the plane defined by the first end of the first chamber; and a receiver antenna disposed within the second chamber for receiving the test signal.

3. The method for making transmission measurements of claim 1 with an electromagnetic device in the anechoic chamber further comprising the steps of:

(a) positioning the electromagnetic device between the first and second aperture of the anechoic chamber;

(b) transmitting a test signal from the transmitter antenna through the electromagnetic device to a receiver antenna; and (c) storing the signal received by the receiver antenna, $D_1$, $D_2, \ldots D_m$.

4. The method for making transmission measurements of claim 3 wherein the step of spatially averaging the plurality of transmission values includes the step of determining the spatially averaged measurement, SAM, corresponding to the scaled, summed and averaged measurements taken at the different antenna positions, at each frequency in accordance with the relation:

$$SAM = [(D_1/ND_1) + (D_2/ND_2) + \ldots + (D_m/ND_m)]/m,$$

where $D_1, D_2, \ldots D_m$ represents the measurements taken at the selected transmitter antenna positions, $Tx_1, Tx_2, \ldots, Tx_m$, with the test device in the anechoic chamber;

$ND_1, ND_2, \ldots, ND_m$ represents the measurements taken at the selected transmitter antenna positions, $Tx_1, Tx_2, \ldots, Tx_m$, without the test device;

$D_1$, and $ND_1$ correspond to the same transmitter antenna position $Tx_1$;

$D_2$, and $ND_2$ correspond to the same transmitter antenna position $Tx_2$;

$D_m$, and $ND_m$ correspond to the same transmitter antenna position $Tx_m$; and m represents the number of transmitter antenna positions selected.

* * * * *